United States Patent
Lam

(10) Patent No.: US 9,509,263 B2
(45) Date of Patent: Nov. 29, 2016

(54) AMPLIFIERS AND RELATED BIASING METHODS AND DEVICES

(71) Applicant: PEREGRINE SEMICONDUCTOR CORPORATION, San Diego, CA (US)

(72) Inventor: Fleming Lam, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/622,650

(22) Filed: Feb. 13, 2015

(65) Prior Publication Data

US 2015/0311876 A1    Oct. 29, 2015

Related U.S. Application Data

(63) Continuation of application No. 13/735,830, filed on Jan. 7, 2013, now Pat. No. 8,970,303, which is a continuation of application No. 12/807,365, filed on Sep. 1, 2010, now Pat. No. 8,350,624.

(51) Int. Cl.
  *H03F 3/45*    (2006.01)
  *H03F 1/02*    (2006.01)
  (Continued)

(52) U.S. Cl.
  CPC ........ *H03F 3/45179* (2013.01); *H03F 1/0272* (2013.01); *H03F 1/223* (2013.01); *H03F 1/523* (2013.01); *H03F 3/45188* (2013.01); *H03F 3/45708* (2013.01); *H03F 3/45* (2013.01); *H03F 2200/471* (2013.01); *H03F 2203/30063* (2013.01); *H03F 2203/45024* (2013.01);
  (Continued)

(58) Field of Classification Search
  CPC .......... H03F 3/45; H03F 2203/45024; H03F 2200/471; H03F 2203/45418; H03F 2203/45311; H03F 2203/45244; H03F 3/45188; H03F 3/45708; H03F 1/523; H03F 1/223; H03F 1/0272; H03F 3/45179; H03F 3/193; H03F 2200/451; H03F 2200/294; H03F 3/195; H03F 3/211; H03F 1/26; H03F 1/0277; H03F 2200/387; H03F 2200/411; H03F 1/0205; H03F 1/56; H03F 2200/18
  USPC ................ 330/253, 255, 258, 261, 285, 296
  See application file for complete search history.

(56) References Cited

U.S. PATENT DOCUMENTS

| 3,469,212 A | 9/1969 | Georg et al. |
| 4,528,517 A | 7/1985 | Schlotzhauer |

(Continued)

FOREIGN PATENT DOCUMENTS

| DE | 112011103626 | 9/2013 |
| EP | 1774620 | 10/2014 |

(Continued)

OTHER PUBLICATIONS

Nguyen, Khanh V Office Action received from the USPTO dated Jan. 14, 2014 for U.S. Appl. No. 13/735,830, 21 pgs.

(Continued)

*Primary Examiner* — Khanh V Nguyen
(74) *Attorney, Agent, or Firm* — Jaquez Land Greenhaus LLP; Martin J. Jaquez, Esq.; Alessandro Steinfl, Esq.

(57) ABSTRACT

Biasing methods and devices for amplifiers are described. The described methods generate bias voltages proportional to the amplifier output voltage to control stress voltages across transistors used within the amplifier.

20 Claims, 3 Drawing Sheets

(51) Int. Cl.
*H03F 1/22* (2006.01)
*H03F 1/52* (2006.01)

(52) U.S. Cl.
CPC .............. *H03F2203/45244* (2013.01); *H03F 2203/45311* (2013.01); *H03F 2203/45418* (2013.01)

(56) References Cited

U.S. PATENT DOCUMENTS

| | | |
|---|---|---|
| 5,032,799 A | 7/1991 | Milberger et al. |
| 5,331,221 A | 7/1994 | Ganesan et al. |
| 5,349,306 A | 9/1994 | Apel |
| 5,732,334 A | 3/1998 | Miyake |
| 5,945,879 A | 8/1999 | Rodwell et al. |
| 5,969,571 A | 10/1999 | Swanson |
| 6,020,848 A | 2/2000 | Wallace et al. |
| 6,064,253 A | 5/2000 | Faulkner et al. |
| 6,107,885 A | 8/2000 | Miguelez et al. |
| 6,137,367 A | 10/2000 | Ezzedine et al. |
| 6,525,608 B2 | 2/2003 | Krupnik |
| 6,630,867 B2 | 10/2003 | Canyon et al. |
| 6,636,114 B2 | 10/2003 | Tsutsui et al. |
| 6,646,511 B2 | 11/2003 | Canyon et al. |
| 6,734,730 B2 | 5/2004 | Doi |
| 6,762,704 B1 | 7/2004 | Melanson et al. |
| 6,853,244 B2 | 2/2005 | Robinson et al. |
| 6,934,520 B2 | 8/2005 | Rozsypal |
| 6,954,623 B2 | 10/2005 | Chang et al. |
| 7,068,096 B2 | 6/2006 | Chu |
| 7,071,858 B2* | 7/2006 | Pan .................... H03K 19/1738 330/253 |
| 7,088,971 B2 | 8/2006 | Burgener et al. |
| 7,098,734 B2 | 8/2006 | Hongo et al. |
| 7,109,791 B1 | 9/2006 | Epperson |
| 7,173,491 B2 | 2/2007 | Bocock et al. |
| 7,190,222 B2 | 3/2007 | Okazaki et al. |
| 7,202,712 B2 | 4/2007 | Athas |
| 7,202,734 B1 | 4/2007 | Raab |
| 7,248,120 B2* | 7/2007 | Burgener ................ H03F 1/223 330/311 |
| 7,359,677 B2 | 4/2008 | Huang et al. |
| 7,457,594 B2 | 11/2008 | Theobold et al. |
| 7,489,196 B2 | 2/2009 | Vaiana et al. |
| 7,545,216 B2 | 6/2009 | Hamley |
| 7,551,032 B2 | 6/2009 | Dupuis et al. |
| 7,551,036 B2 | 6/2009 | Berroth et al. |
| 7,586,376 B2 | 9/2009 | Litmanen |
| 7,602,227 B2 | 10/2009 | Kim et al. |
| 7,609,109 B2 | 10/2009 | Arisawa |
| 7,639,068 B2 | 12/2009 | Mizuno et al. |
| 7,679,433 B1 | 3/2010 | Li |
| 7,756,494 B2 | 7/2010 | Fujioka et al. |
| 7,786,807 B1 | 8/2010 | Li et al. |
| 7,795,968 B1 | 9/2010 | Li et al. |
| 7,817,966 B2 | 10/2010 | Prikhodko et al. |
| 7,868,683 B2 | 1/2011 | Ilkov |
| 7,872,533 B2 | 1/2011 | Adamski et al. |
| 7,936,213 B2 | 5/2011 | Shin et al. |
| 7,961,052 B2 | 6/2011 | Bacon et al. |
| 8,093,945 B2 | 1/2012 | Wimpenny |
| 8,103,226 B2 | 1/2012 | Andrys et al. |
| 8,106,711 B2 | 1/2012 | Adamski et al. |
| 8,111,104 B2 | 2/2012 | Ahadian et al. |
| 8,130,042 B2 | 3/2012 | Adamski et al. |
| 8,131,251 B2 | 3/2012 | Burgener et al. |
| 8,195,103 B2 | 6/2012 | Waheed et al. |
| 8,253,494 B2 | 8/2012 | Blednov |
| 8,350,624 B2 | 1/2013 | Lam |
| 8,368,462 B2 | 2/2013 | Sharma et al. |
| 8,373,490 B2 | 2/2013 | Burgener et al. |
| 8,427,241 B2 | 4/2013 | Ezzeddine et al. |
| 8,487,706 B2 | 7/2013 | Li et al. |
| 8,502,607 B2 | 8/2013 | Adamski et al. |
| 8,559,907 B2 | 10/2013 | Burgener et al. |
| 8,649,754 B2 | 2/2014 | Burgener et al. |
| 8,970,303 B2 | 3/2015 | Lam |
| 9,000,841 B2 | 4/2015 | Sharma et al. |
| 9,190,902 B2 | 11/2015 | Burgener et al. |
| 9,331,738 B2 | 5/2016 | Sharma et al. |
| 9,369,087 B2 | 6/2016 | Burgener et al. |
| 2001/0013814 A1 | 8/2001 | Arisawa |
| 2002/0079971 A1 | 6/2002 | Vathulya |
| 2002/0171486 A1 | 11/2002 | Krupnik |
| 2003/0090313 A1 | 5/2003 | Burgener et al. |
| 2005/0068102 A1 | 3/2005 | Hongo et al. |
| 2005/0122163 A1 | 6/2005 | Chu |
| 2005/0140448 A1 | 6/2005 | Diorio |
| 2005/0195030 A1 | 9/2005 | Okazaki et al. |
| 2006/0006955 A1 | 1/2006 | Arisawa |
| 2006/0220747 A1 | 10/2006 | Kiji |
| 2006/0281418 A1 | 12/2006 | Huang et al. |
| 2007/0018718 A1 | 1/2007 | Horng et al. |
| 2007/0229156 A1 | 10/2007 | Alenin et al. |
| 2007/0243849 A1 | 10/2007 | Prikhodko et al. |
| 2008/0166984 A1 | 7/2008 | Shie et al. |
| 2008/0246543 A1 | 10/2008 | Trifonov et al. |
| 2009/0174495 A1 | 7/2009 | Arisawa |
| 2009/0251215 A1 | 10/2009 | Hughes |
| 2010/0330938 A1 | 12/2010 | Yin |
| 2011/0299437 A1 | 12/2011 | Mikhemar et al. |
| 2012/0007679 A1 | 1/2012 | Burgener et al. |
| 2012/0049956 A1 | 3/2012 | Lam |
| 2012/0086512 A1 | 4/2012 | Sharma et al. |
| 2012/0105127 A1 | 5/2012 | Burgener et al. |
| 2012/0194274 A1 | 8/2012 | Fowers et al. |
| 2014/0022016 A1 | 1/2014 | Lam |
| 2014/0028521 A1 | 1/2014 | Bauder et al. |
| 2014/0044216 A1 | 2/2014 | Sharma et al. |
| 2014/0085006 A1 | 3/2014 | Mostov et al. |
| 2014/0087673 A1 | 3/2014 | Mostov et al. |
| 2014/0179249 A1 | 6/2014 | Burgener et al. |
| 2014/0306767 A1 | 10/2014 | Burgener et al. |
| 2015/0303985 A1 | 10/2015 | Sharma et al. |

FOREIGN PATENT DOCUMENTS

| | | |
|---|---|---|
| EP | 2884586 | 6/2015 |
| WO | WO2012/058122 A1 | 5/2012 |

OTHER PUBLICATIONS

Lam, Fleming, Response filed in the USPTO dated Jun. 16, 2014 for U.S. Appl. No. 13/735,830, 9 pgs.
Nguyen, Khanh V Notice of Allowance received from the USPTO dated Oct. 1, 2014 for U.S. Appl. No. 13/735,830, 15 pgs.
Peregrine Semiconductor Corporation, Response filed in the EPO dated Dec. 4, 2014 for appln. No. 14182150, 6 pgs.
Tran, Pablo No., Office Action received from the USPTO dated Feb. 24, 2015 for U.S. Appl. No. 14/177,062, 5 pgs.
European Patent Office, Invitation Pursuant to Rule 63(1) EPC received from the EPO dated Mar. 3, 2015 for appln. No. 14182150. 4, 3 pgs.
Peregrine Semiconductor Corporation, Response filed in the EPO dated Apr. 29, 2015 for appln. No. 14182150.4, 7 pgs.
Ezzeddine, et al., "The High Voltage/High Power FET (HiVP1)", 2003 IEEE Radio Frequency Integrated Circuits Symposium, pp. 215-218.
Aquilani, Dario, Extended Search Report received from the EPO dated Jun. 11, 2015 for appln. No. 14182150.4, 9 pgs.
Nguyen, Patricia T., Office Action received from the USPTO dated Oct. 8, 2015 for U.S. Appl. No. 14/603,169, 20 pgs.
Peregrine Semiconductor Corporation, Demand filed in the EPO dated Aug. 24, 2012 for appln. No. PCT/US2011/057381, 24 pgs.
Houston, Adam, Notice of Allowance received from the USPTO dated Aug. 27, 2012 for appln. No. 12/913,575, 9 pgs.
Nguyen, Patricia, Notice of Allowance received from the USPTO dated Sep. 27, 2012 for U.S. Appl. No. 12/924,907, 40 pgs.
Ratajski, Andre, Written Opinion of the International Preliminary Examining Authority received from the EPO dated Oct. 18, 2012 for appln. No. PCT/US2011/057381, 6 pgs.

(56) References Cited

OTHER PUBLICATIONS

Tran, Pablo, Notice of Allowance received from the USPTO dated Oct. 26, 2012 for U.S. Appl. No. 12/903,848, 14 pgs.
Choe, Henry, Notice of Allowance received from the USPTO dated Nov. 1, 2012 for U.S. Appl. No. 12/657,728, 10 pgs.
Burgener, et al., Response filed in the USPTO dated Jul. 23, 2012 for U.S. Appl. No. 12/913,575, 7 pgs.
Choe, Henry, Notice of Allowance received from the USPTO dated Aug. 2, 2012 for U.S. Appl. 13/008,711, 15 pgs.
Burgener, et al., Response filed in the USPTO dated Aug. 3, 2012 for U.S. Appl. No. 12/903,848, 5 pgs.
Ghilini, Marie, International Search Report and Written Opinion received from the EPO dated Apr. 16, 2012 for appln. No. PCT/US2011/057381, 11 pgs.
Houston, Adam D., Office Action received from the USPTO dated Jun. 26, 2012 for U.S. Appl. No. 12/913,575, 19 pgs.
Adamski, et al., Response filed in the USPTO dated Dec. 13, 2011 for U.S. Appl. No. 13/008,711, 5 pgs.
Choe, Henry, Notice of Allowance received from the USPTO dated Jan. 10, 2012 for U.S. Appl. No. 13/008,711, 10 pgs.
Tran, Pablo N., Office Action received from the USPTO dated Feb. 3, 2012 for U.S. Appl. No. 12/903,848, 46 pgs.
Choe, Henry, Office Action received from the USPTO dated Sep. 13, 2011 for U.S. Appl. No. 13/008,711, 13 pgs.
Nguyen, Hieu, Notice of Allowance received from the USPTO dated Sep. 20, 2011 for U.S. Appl. No. 12/590,839, 13 pgs.
Nguyen, Hieu, Notice of Allowance received from the USPTO dated Sep. 29, 2011 for U.S. Appl. No. 12/657,727, 14 pgs.
Tran, Pablo N., Notice of Allowance received from the USPTO dated Oct. 6, 2011 for U.S. Appl. No. 11/501,125, 11 pgs.
Choe, Henry, Notice of Allowance received from the USPTO dated Oct. 14, 2011 for U.S. Appl. No. 12/799,910, 23 pgs.
Tran, Pablo N., Notice of Allowance received from the USPTO dated May 19, 2011 for U.S. Appl. No. 11/501,125, 11 pgs.
Nguyen, Hieu P., Office Action received from the USPTO for U.S. Appl. No. 12/657,727 dated Jun. 10, 2011, 12 pgs.
Choe, Henry, Office Action received from the USPTO for U.S. Appl. No. 12/657,728 dated Jun. 15, 2011, 4 pgs.
Nguyen, Khanh, Notice of Allowance received from the USPTO dated Sep. 6, 2012 for U.S. Appl. No. 12/807,365, 13 pgs.
Lam, Fleming, Response filed in the USPTO dated Jul. 3, 2012 for U.S. Appl. No. 12/807,365, 8 pgs.
Nguyen, Khanh, Office Action received from the USPTO dated Apr. 5, 2012 for U.S. Appl. No. 12/807,365, 10 pgs.
Lam, Fleming, Response filed in the USPTO dated Feb. 6, 2012 for U.S. Appl. No. 12/807,365, 12 pgs.
Nguyen, Khanh, Office Action received from the USPTO dated Nov. 4, 2011 for U.S. Appl. No. 12/807,365, 14 pgs.

Ghilini, Marie, International Preliminary Report on Patentability received from the EPO dated Jan. 9, 2013 for appln. No. PCT/US2011/057381, 17 pgs.
Aquilani, Dario, Communication Pursuant to Article 94(3) EPC received from the EPO dated Jan. 21, 2013 for appln. No. 05763216.814 pgs.
Tran, Pablo N., Notice of Allowance received from the USPTO dated Feb. 15, 2013 for U.S. Appl. No. 12/903,848, 26 pgs.
Choe, Henry, Notice of Allowance received from the USPTO dated Apr. 5, 2013 for U.S. Appl. No. 13/008,711, 15 pgs.
Tran, Pablo N., Notice of Allowance received from the USPTO dated May 16, 2013 for U.S. Appl. No. 12/903,848, 101 pgs.
Tran, Pablo N., Notice of Allowance received from the USPTO dated Jun. 6, 2013 for U.S. Appl. No. 13/412,463, 142 pgs.
Burgener, et al., Amendment filed in the USPTO dated May 20, 2013 for U.S. Appl. No. 13/412,463, 6 pgs.
Adamski, et al., Comments on Examiners Statement of Reasons for Allowance filed in USPTO on Jul. 3, 2013 for U.S. Appl. No. 13/008,711, 3 pgs.
Peregrine Semiconductor Corporation, Response filed in the EPO dated Jul. 29, 2013 for appln. No. 05763216.8, 17 pgs.
Tran, Pablo N., Notice of Allowance received from USPTO on Aug. 28, 2013 for U.S. Appl. No. 12/903,848, 18 pgs.
Nguyen, Patricia T., Office Action received from USPTO on Apr. 1, 2014 for U.S. Appl. No. 13/758,895, 4 pgs.
European Patent Office, Intention to Grant received from the EPO dated Apr. 25, 2014 for appln. No. 05763216.8-1852, 47 pgs.
Tran, Pablo N., Office Action received from the USPTO dated May 8, 2014 for U.S. Appl. No. 14/052,680, 5 pgs.
Tran, Pablo N., Office Action received from the USPTO dated Aug. 7, 2014 for U.S. Appl. No. 14/177,062, 7 pgs.
Sharma, et al., Response filed in the USPTO dated Aug. 29, 2014 for U.S. Appl. No. 13/758,895, 6 pgs.
Aquilani, D., Decision to grant a European patent pursuant to Article 97(1) EPC dated Sep. 4, 2014 for appln. No. 05763216.8, 2 pgs.
Nguyen, Patricia T., Notice of Allowance received from the USPTO dated Nov. 4, 2014 for U.S. Appl. No. 13/758,895, 12 pgs.
Burgener, et al., Response filed in the USPTO dated Nov.6, 2014 for U.S. Appl. No. 14/177,062, 15 pgs.
Burgener, et al., Amendment filed in the USPTO dated Nov. 10, 2014 for U.S. Appl. No. 14/052,680, 13 pgs.
Sharma, et al., Amendment filed in the USPTO dated Nov. 13, 2015 for U.S. Appl. No. 14/603,169, 7 pgs.
Burgener, et al., Response filed in the USPTO dated Dec. 3, 2015 for U.S. Appl. No. 14/177,062, 9 pgs.
Nguyen, Patricia, Notice of Allowance received from the USPTO dated Jan. 4, 2016 for U.S. Appl. No. 14/603,169, 10 pgs.
Peregrine Semiconductor Corporation, Response filed in the EPO dated Jan. 13, 2016 for appln. No. 14182150.4, 15 pgs.
Iran, Pablo N., Notice of Allowance received from the USPTO dated Mar. 25, 2016 for U.S. Appl. No. 14/177,062, 146 pgs.

* cited by examiner

AMPLIFIERS AND RELATED BIASING METHODS AND DEVICES

CROSS REFERENCE TO RELATED APPLICATIONS

Claim of Priority

The present application is a continuation of commonly owned co-pending U.S. patent application Ser. No. 13/735,830 filed on Jan. 7, 2013, which is a continuation of commonly owned co-pending U.S. patent application Ser. No. 12/807,365 filed on Sep. 1, 2010, which issued on Jan. 8, 2013 as U.S. Pat. No. 8,350,624; and the above-cited patent applications and issued patent are incorporated herein by reference in their entirety as if set forth in full.

BACKGROUND

1. Field

The present teachings relate to amplifier biasing. In particular, the present teachings relate to amplifiers and related methods and devices.

2. Description of Related Art

In low voltage (<4 volt) semiconductor technology such as silicon on insulator (SOI), typical transistors can only withstand a limited voltage across the drain-source terminals before experiencing reliability issues. A typical maximum voltage is around 4 volts for an SOI technology with a minimum feature size of 0.5 um for the gate electrode and decreases as the minimum feature size is decreased. This limitation poses a challenge when designing circuitry such as an operational amplifier intended to operate at a much higher power supply voltage (such as 10 V or greater). Typical applications using high voltage amplifiers, involve generating output common mode voltages approaching the limits of the positive and negative supply. In a careful design, the constituent transistors of such amplifiers do not experience excessive voltage across their drain and source terminal as to incur reliability issues. Moreover, a high voltage operational amplifier is designed to deliver a wide range of input common mode levels approaching the positive and negative supply.

FIG. 1 shows an output stage (100) of a folded cascode topology high voltage operational amplifier. The folded cascode refers to the folding of N-channel cascode active loads of a differential pair and then changing the MOSFETs to P-channel. The amplifier output stage (100) is designed to provide an output voltage which approaches a positive and negative supply, VDD and VSS in the Figure, by using a series of stacked transistors VCascode_x (x ranging from 1 to 24 in the example of the Figure) of complementary devices (N-channel FETs and P-channel FETs in the example of the Figure) in a push-pull fashion. The push-pull comes from the ability to drive either a positive or negative current into a load by using a complementary pair of transistors (N-channel and P-channel). Transistors (110), (111), (112), and (113) are used to set a bias current through the output stage (100) transistors via gate bias node voltage (120) and (130).

Referring to FIG. 1, a number of transistor devices needed in series depends on a total voltage that the operational amplifier output stage (100) is able to withstand. For a given stress voltage level supported by a technology, a higher voltage supply implies the use of a higher number of transistors stacked.

Further referring to FIG. 1, it is desirable that the series stacked cascode transistors VCascode_x be biased in a way to ensure that the total voltage across the stack is evenly distributed among the transistors VCascode_x. In this way, it is ensured that each transistor is not over stressed with a voltage between drain and source terminals which exceeds the limits of the fabrication technology.

SUMMARY

According to a first aspect of the present disclosure, a biasing method is provided, comprising the steps of: providing an amplifier having an amplifier output node; sensing an output voltage at the amplifier output node; and generating one or more bias voltages proportional to the output voltage to bias the amplifier.

According to a second aspect of the disclosure, a bias circuit is provided, the bias circuit being connectable, during operation, to an output stage of an amplifier comprising a plurality of amplifier MOSFET devices to produce an output voltage at an amplifier output node, the bias circuit comprising: a sensing section to sense the amplifier output voltage; and a biasing section connected with the sensing section to provide, during operation, bias voltages proportional to the output voltage to gate terminals of the amplifier MOSFET devices.

According to a third aspect, a bias circuit is provided, the bias circuit being connectable, during operation, to an amplifier comprising a plurality of amplifier MOSFET devices to produce an output voltage at an amplifier output node, the bias circuit comprising a plurality of biasing MOSFET devices arranged in a cascode configuration and serially connected with an in-series arrangement of a plurality of resistors wherein during operation: a gate terminal of one of the MOSFET devices is connected with the amplifier output node; and a current proportional to the amplifier output voltage is generated through the plurality of resistors to provide bias voltages to gate terminals of the plurality of amplifier MOSFET devices.

According to a fourth aspect, a biasing method is provided, the method comprising the steps of: providing a differential amplifier with an input common mode node; sensing an input common mode voltage at the input common mode node; and producing one or more bias voltages proportional to the input common mode voltage to bias the differential amplifier.

According to a fifth aspect, a bias circuit is provided, the bias circuit being connectable, during operation, to an input stage of a differential amplifier comprising a plurality of amplifier MOSFET devices to produce an input common mode voltage at an amplifier input common mode node, the bias circuit comprising: a sensing section to sense the amplifier input common mode voltage; and a biasing section connected with the sensing section to provide, during operation, bias voltages proportional to the input common mode voltage to gate terminals of the amplifier MOSFET devices.

According to a sixth aspect, a bias circuit is provided, the bias circuit being connectable, during operation, to a differential amplifier comprising a plurality of amplifier MOSFET devices to produce an output voltage at an amplifier input common mode node, the bias circuit comprising a plurality of biasing MOSFET devices arranged in a cascode configuration and serially connected with an in-series arrangement of a plurality of resistors wherein during operation: a gate terminal of one of the MOSFET devices is connected with the amplifier input common mode node; and a current proportional to the amplifier input common mode voltage is generated through the plurality of resistors to provide bias voltages to gate terminals of the plurality of amplifier MOSFET devices.

According to a seventh aspect, an amplifier is provided, comprising: an amplifier differential output stage having two complementary sides, each side having an output node and comprising a stack of N-type and P-type MOSFET transistors arranged in series; and two biasing circuits each comprising: a first stack comprising: a plurality of MOSFET devices of a first type arranged in a cascode configuration; and a plurality of series resistor arranged in series with the plurality of MOSFET devices of the first type; and a second stack comprising: a plurality of MOSFET devices of a second type, opposite of the first type, arranged in a cascode configuration; and a plurality of series resistor arranged in-series with the plurality of MOSFET devices of the second type; wherein in each biasing circuit: a gate terminal of one of the plurality of MOSFET devices of the first type and a gate terminal of one of the plurality of MOSFET devices of the second type are connected with the output node of one of the two complementary sides and wherein during operation: currents proportional to output voltages generated at the output nodes flow through the series resistors within the biasing circuits to produce bias voltages for gate terminals of the N-type and P-type MOSFET transistors of the amplifier differential output stage.

According to an eighth aspect, an amplifier is provided, comprising: a) an amplifier differential input stage having an input common mode voltage node and a plurality of amplifier MOSFET devices; and b) a biasing circuit comprising: b1) a first stack comprising: a plurality of biasing MOSFET devices of a first type arranged in a cascode configuration; and a plurality of series resistors arranged in series with the plurality of biasing MOSFET devices of the first type; and b2) a second stack comprising: a plurality of biasing MOSFET devices of a second type, opposite of the first type, arranged in a cascode configuration; and a plurality of series resistors arranged in-series with the plurality of biasing MOSFET devices of the second type; wherein: a gate terminal of one of the plurality of biasing MOSFET devices of the first type and gate terminal of one of the plurality of biasing MOSFET devices of the second type are connected with the input common mode node of the amplifier input differential stage and wherein during operation: currents proportional to an input common mode voltage generated at the input common mode node flow through the series resistors within the biasing circuit to produce bias voltages to gate terminals of the plurality of the amplifier MOSFET devices.

Further aspects of the disclosure are shown in the specification, drawings and claims of the present application.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

In particular, biasing methods and devices for use in high power amplifiers in accordance with the embodiments of the present disclosure are described. The described high power amplifiers can be fabricated in a low voltage technology and can safely operate from a high voltage supply which is significantly larger than the maximum voltage allowed across a single device for the given technology.

Figure 1:
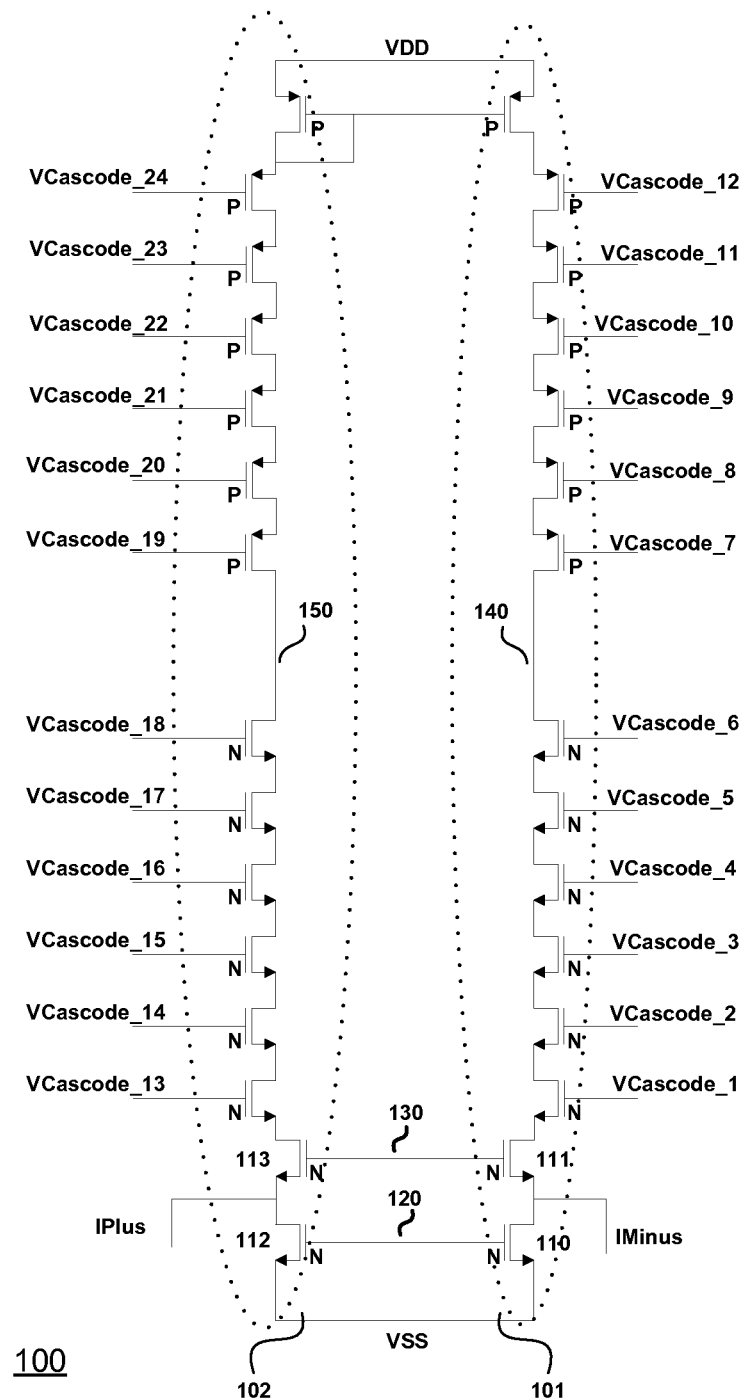
FIG. 1 shows a known folded cascode operation amplifier output stage.
Figure 2:
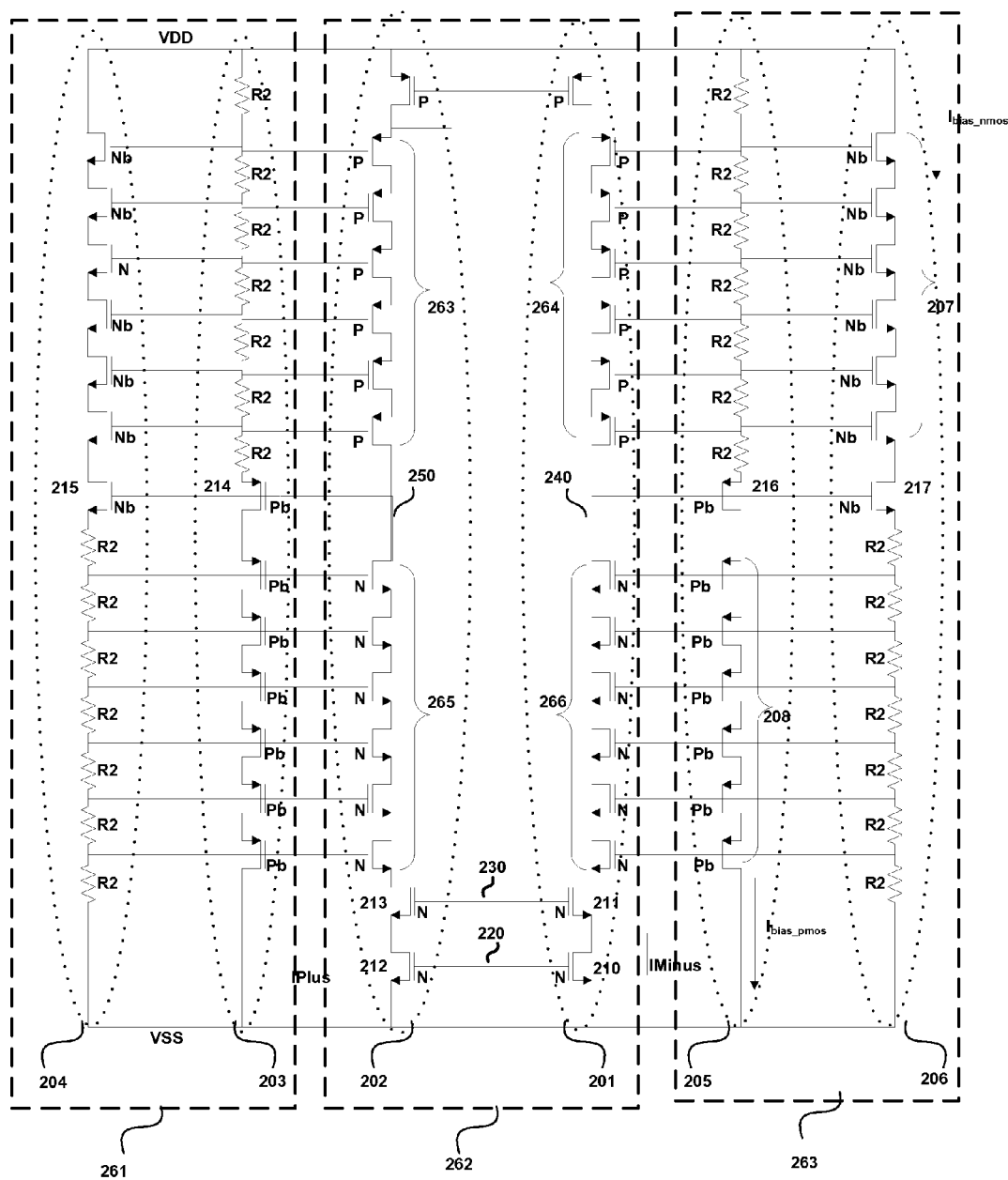
FIG. 2 shows a circuit comprising a folder cascode amplifier output stage with biasing transistor-resistor networks in accordance with the teachings of the present disclosure.

FIG. 2 shows a circuit (200) comprising an amplifier output stage (262) and two biasing networks (261, 263) according to an embodiment of the present disclosure. Each of the biasing networks (261) and (263) comprises series transistors Pb, Nb (the first letter 'P' or 'N' represents the type of transistor, i.e. P-type and N-type, and the second letter 'b' intends to indicate the term 'bias') and series resistors R2. As shown in FIG. 2, the amplifier output stage (262) further comprises cascode devices (263, 264, 265, 266). The cascode devices (263, 265) are of P-type and the cascode devices (264, 266) are of N-type. The biasing network (261) provides gate biasing for the cascode devices (263, 265) and, in the same way, the biasing network (263) provides gate biasing for the cascode devices (264, 266). Output nodes (240) and (250) are also shown in FIG. 2. VDD and VSS represent respectively a positive and a negative power supply for the circuit (200).

Referring to the embodiment of FIG. 2, the output node (240) voltage of the amplifier output stage (262) is fed into gate terminals of the series transistors (216) and (217). If the output node (240) voltage increases, the series transistor (216) is biased at a lower gate to source voltage resulting in a reduction of a bias current $I_{bias\_pmos}$ through a biasing transistor-resistor stack (205). The reduced bias $I_{bias\_pmos}$ current results in less voltage drop across each series resistor R2 in the biasing transistor-resistor stack (205). According to an embodiment of the present disclosure, the series resistors R2 are chosen to have equal resistance values such that there is equal voltage division among the series resistors R2. The series resistors R2 in the biasing transistor-resistor stack (205) are used to generate the cascode bias voltages to the P-channel cascode devices (264) in the output stage (262) of the amplifier as well as to the series stacked N-channel devices (207) in a biasing transistor-resistor stack (206).

Further referring to FIG. 2 and continuing with the discussion above, if the output node (240) voltage increases, an opposite effect will occur in the transistor-resistor stack (206). In other words, the series transistor (217) is biased at a higher gate voltage resulting in an increased $I_{bias\_nmos}$ through biasing transistor-resistor stack (206). As a result, the voltage drop across the series resistors R2 in the biasing transistor-resistor stack (206) is increased. According to an embodiment of the present disclosure, the series resistors R2 are chosen to have equal resistance value such that there is equal voltage division among the series resistors R2 in the biasing transistor-resistor stack (206). The series resistors R2 in the biasing transistor-resistor stack (206) are used to generate cascode bias voltages to the N-type cascode devices (266) in the output stage (262) of the amplifier as well as P-type series stacked devices (208) in the biasing transistor-resistor stack (205).

With continued reference to FIG. 2, if the output node (240) voltage is decreased, the behavior of the biasing transistor-resistor stacks (205) and (206) are swapped relative to the scenario where the output node (240) voltage is increased, as described above. In other words, when the output node (240) voltage is decreased, the series transistors (216) are biased at a lower gate bias voltage and, as a result, the current $I_{bias\_pmos}$ flowing in the biasing transistor-resistor stack (205) is increased. This implies a larger voltage drop across any of the series resistors R2 in the transistor-resistor stack (205) resulting in larger bias voltages to bias the P-type cascode devices (264) in the output stage (262) of the amplifier as well as series stacked N-channel devices (207) in a biasing transistor-resistor stack (206). At the same time, a decreased output node (240) voltage results in a lower gate bias to the series transistor (217). As a result, the current $I_{bias\_nmos}$ through the device as well as the series resistors R2 in the biasing transistor-resistor stack (206) is decreased. This generates smaller bias voltages to bias the N-type cascode devices (266) in the output stage (262) of the amplifier as well as the P-type series stacked devices in the biasing transistor-resistor stack (205).

Based on the description set forth above, the person skilled in the art will appreciate that the biasing transistor-resistor stacks (205, 206) of FIG. 2 work together to sense the output node (240) voltage of the amplifier and adjust the biasing voltages to the cascode transistors (264, 266) through series resistors R2 of the transistor-resistor stacks (205, 206). As a result of scaling bias voltages of the cascode devices (264, 266) proportional to the output node (240) voltage, each transistor within the output stage (262) will operate within a safe drain-source voltage level.

Referring to FIG. 2, the person skilled in the art will understand that, depending on the magnitude of the positive supply voltage VDD and the negative supply voltage VSS to the circuit (200), a number of transistors and resistors placed in the transistor-resistor stacks (205, 206) can be adjusted in various embodiments of the present disclosure. In this way, for a given technology, acceptable voltage ranges across each transistor can be provided to avoid transistor breakdown and operational failures.

Although in some applications one may use only one of the output nodes (240, 250) in a single-ended fashion, according to an embodiment of the present disclosure, the circuit (200) of FIG. 2 is designed differentially comprising two sides (201, 202) that are complementary. As such, the cascode transistors (264, 266) within the side (201) play a substantially similar role to the cascode transistors (263, 265) within the complementary side (202). As a consequence, the same mechanism as described above is implemented to avoid over-stressing the cascode transistors (263, 265). This is accomplished by utilizing the biasing transistor-resistor stacks (203, 204) in a substantially similar way as previously described with reference to the biasing transistor-resistor stacks (205, 206). This time, the output node (250) is sensed by the transistor-resistor stacks (203, 204) to adjust gate biasing of the cascode devices (263, 265) in such a way that over-stressing of the cascode devices (263, 265) is avoided.

Methods used to bias devices and methods for increasing an input common mode range of high voltage amplifiers are now described. The input common mode is the range of voltage that can be applied to the input terminals while ensuring that the amplifier behaves as expected.

Figure 3:
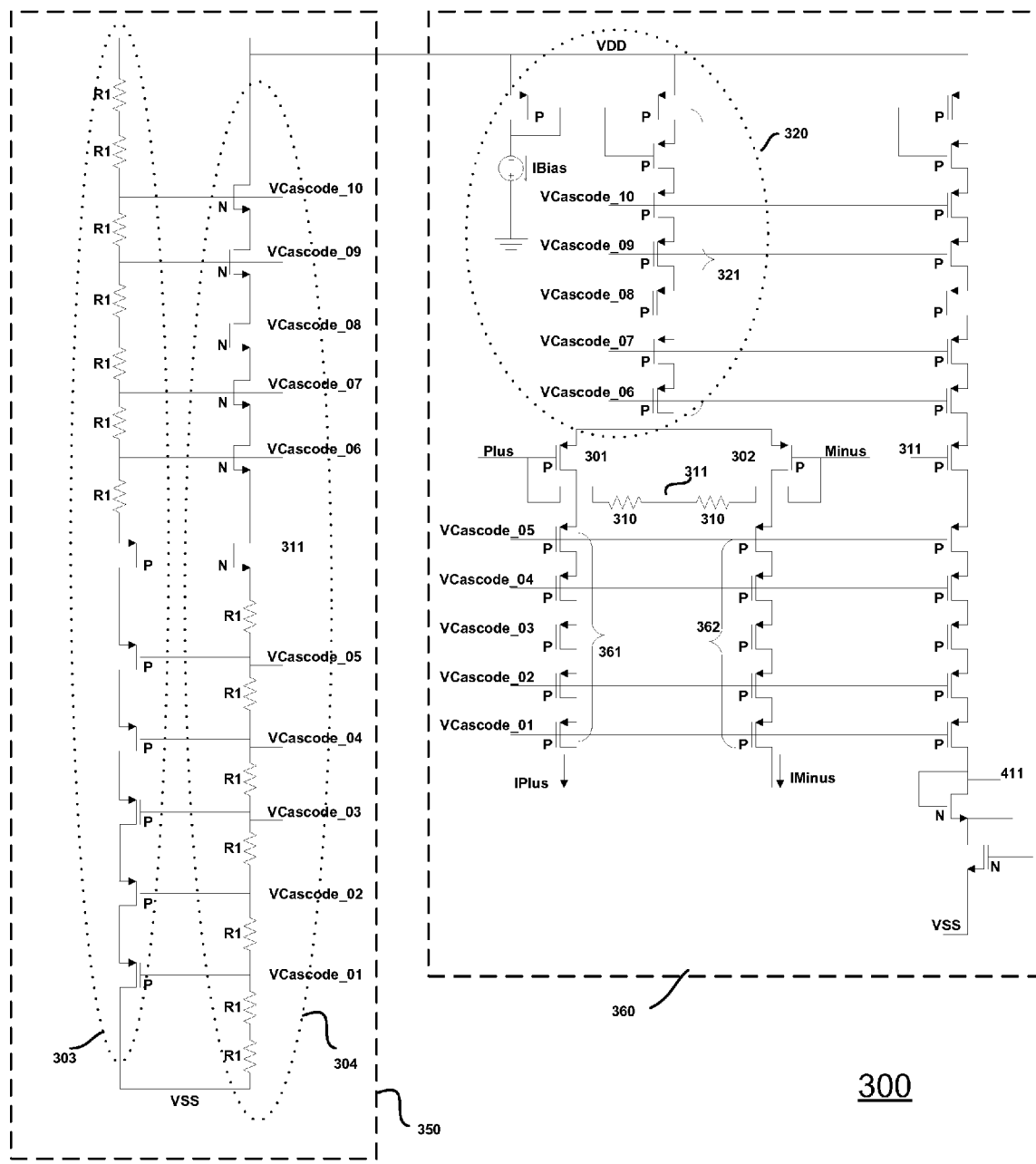
FIG. 3 shows a circuit comprising a folder cascode amplifier input stage with biasing transistor-resistor networks in accordance with the teachings of the present disclosure.

FIG. 3 shows a circuit (300) comprising an input stage (360) of an amplifier and biasing transistor-resistor stacks (303, 304) in accordance with an embodiment of the present disclosure. The input stage (360) of the amplifier comprises input transistors (301, 302) paired differentially. As shown in FIG. 3, cascode transistors (361, 362) are used in series with the input transistors (301, 302). A cascoded current source (320) is also shown in FIG. 3. The current source (320) comprises cascode transistors (321) and provides bias current for the input stage (360).

Referring to FIG. 3, in order to avoid over-stressing and break down, bias voltages for the cascode devices (321, 361, 362) are adjusted as an input common mode voltage at an input common mode sensing node (311) to the input transistors (360) varies during operation of the circuit (300). In order to accomplish this, a pair of biasing transistor-resistor stacks (303, 304) is used to sense the input common mode voltage through two equal value resistors (310) at the input common mode sensing node (311). Once the input common mode voltage is sensed, the bias voltages for the cascode devices (321, 361, 362) are adjusted. Adjustment of the bias voltages for the cascode devices (321, 361, 361) is performed in a substantially similar way as the one described with reference to FIG. 2, the difference being that in the embodiment of FIG. 3, the input common mode sensing node (311) is sensed in contrast with the output node (240) of the circuit (200) of FIG. 2.

Referring again to FIG. 3, the transistor-resistor stack (303) generates bias voltages for the cascode transistors (321) and the transistor-resistor stack (304) generates bias voltages for the cascode devices (361, 362). The person skilled in the art will appreciate that by tracking voltage levels and the input common mode sensing node (311), the bias voltages provided to the cascode devices (361, 362, 321) are adjusted to avoid over-stressing of each individual transistor of the cascode transistors (361, 362, 321). The person skilled in the art will also appreciate that the biasing methods described herein allow a design of amplifiers capable of operating with high voltage supplies while being fabricated using a technology such as silicon on insulator (SOI) which inherently allows for low stress voltages for transistors.

Accordingly, what has been shown are biasing methods and devices for amplifiers. While the devices and methods have been described by means of specific embodiments and applications thereof, it is understood that numerous modifications and variations could be made thereto by those skilled in the art without departing from the spirit and scope of the disclosure. It is therefore to be understood that, within the scope of the claims, the disclosure may be practiced otherwise than as specifically described herein.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A biasing method for an amplifier, the biasing method comprising:
   providing an amplifier comprising a first plurality of devices arranged in a first cascode configuration;
   supplying the amplifier with a positive supply voltage and a negative supply voltage;
   sensing a voltage at an amplifier node coupled to the first cascode configuration through a sensing device;

based on the sensing, generating, via a second plurality of devices arranged in a second cascode configuration and a plurality of series-connected resistors coupled to the second cascode configuration via the sensing device, a plurality of bias voltages;

based on the generating, biasing the first plurality of devices; and based on the biasing, operating the amplifier with an increased voltage range of the voltage at the amplifier node, wherein a voltage magnitude of the positive supply voltage is larger than a withstand voltage of: a) each device of the first plurality of devices, b) each device of the second plurality of devices, and c) the sensing device, and a voltage magnitude of the negative supply voltage is larger than a withstand voltage of: a) each device of the first plurality of devices, b) each device of the second plurality of devices, and c) the sensing device.

2. The biasing method of claim 1, wherein the biasing of the first plurality of devices is configured to provide an operation of each device of the first plurality of devices within a withstand voltage of the each device.

3. The biasing method of claim 1, wherein:
the first cascode configuration comprises a first device of the first plurality of devices and a last device of the first plurality of devices,
during operation, the first cascode configuration provides a conduction path from the first device to the last device,
the amplifier node is coupled to the first device of the first cascode configuration,
one of the positive supply voltage and the negative supply voltage is coupled to the last device of the first cascode configuration; and
the biasing of the first plurality of devices further comprises evenly distributing a voltage across the first cascode configuration.

4. The biasing method of claim 3, wherein selection of a number of the first plurality of devices is based on the withstand voltage of any one device of the first plurality of devices, the positive supply voltage, and the negative supply voltage.

5. The biasing method of claim 4, wherein the withstand voltage is equal to or less than 4 volts, and the positive supply voltage and the negative supply voltage are equal to or larger than 10 volts in magnitude.

6. The biasing method of claim 5, wherein the increased voltage range ranges from a high voltage limit approaching the positive supply voltage, to a low voltage limit approaching the negative supply voltage.

7. The biasing method of claim 1, wherein the sensing of the voltage at the amplifier node further comprises:
biasing the sensing device using the voltage at the amplifier node;
based on the biasing of the sensing device, controlling a current through the second cascode configuration;
based on the controlling, providing a current flow through the second cascode configuration proportional to the voltage at the amplifier node, and
based on the providing, obtaining a voltage division among the plurality of series-connected resistors, thus generating the plurality of bias voltages.

8. The biasing method of claim 7, wherein the voltage division is an equal voltage division.

9. The biasing method of claim 7, wherein the amplifier node is an input common mode node of the amplifier.

10. The biasing method of claim 7, wherein the amplifier node is an output node of the amplifier.

11. The biasing method of claim 1, wherein the first plurality of devices of the first cascode configuration, the second plurality of devices of the second cascode configuration, and the sensing device are MOSFET devices.

12. A bias circuit connectable, during operation, to a node of an amplifier coupled to a first plurality of devices arranged in a first cascode configuration, the bias circuit comprising:
a sensing device coupled to the node of the amplifier;
a second plurality of devices arranged in a second cascode configuration;
a plurality of series-connected resistors coupled to the second cascode configuration via the sensing device;
wherein, during operation:
the sensing device senses a voltage at the node of the amplifier and provides a corresponding proportional current flow through the second cascode configuration and the plurality of series-connected resistors,
the current flow through the series-connected resistors provides biasing voltages to the first plurality of devices via a plurality of nodes of the series-connected resistors that increase an operating voltage range of the voltage at the node of the amplifier without overstress of the first plurality of devices, and
the bias circuit operates from a positive supply voltage and a negative supply voltage of the amplifier, wherein:
a voltage magnitude of the positive supply voltage and a voltage magnitude of the negative supply voltage are larger than a withstand voltage of: a) each of the first plurality of devices, b) each of the second plurality of devices, and c) the sensing device.

13. The bias circuit of claim 12, wherein the biasing voltages to the first plurality of devices evenly distribute a voltage across the first cascode configuration.

14. The bias circuit of claim 12, wherein a number of the second plurality of devices of the second cascode configuration is equal to a number of the first plurality of devices of the first cascode configuration.

15. The bias circuit of claim 14, wherein the number is based on a withstand voltage of a device of the first plurality of devices and the operating voltage range of the voltage at the node of the amplifier.

16. The bias circuit of claim 15, wherein the operating voltage range ranges from a high voltage limit approaching the positive supply voltage of the amplifier, to a low voltage limit approaching the negative supply voltage of the amplifier.

17. The bias circuit of claim 16, wherein the withstand voltage is equal to or less than 4 volts, and the positive supply voltage and the negative supply voltage are equal to or larger than 10 volts in magnitude.

18. The bias circuit of claim 12, wherein the node is an input common mode node of the amplifier.

19. The bias circuit of claim 12, wherein the node is an output node of the amplifier.

20. The bias circuit of claim 12, wherein the first plurality of devices of the first cascode configuration, the second plurality of devices of the second cascode configuration, and the sensing device are MOSFET devices.

* * * * *